United States Patent
Kozuma

(10) Patent No.: US 12,266,900 B2
(45) Date of Patent: Apr. 1, 2025

(54) LIGHT SOURCE DEVICE FOR FIBER OPTIC GYROSCOPE AND FIBER OPTIC GYROSCOPE USING THE SAME

(71) Applicant: TOKYO INSTITUTE OF TECHNOLOGY, Tokyo (JP)

(72) Inventor: Mikio Kozuma, Tokyo (JP)

(73) Assignee: INSTITUTE OF SCIENCE TOKYO, Tokyo (JP)

( * ) Notice: Subject to any disclaimer, the term of this patent is extended or adjusted under 35 U.S.C. 154(b) by 273 days.

(21) Appl. No.: 17/786,646

(22) PCT Filed: Nov. 19, 2020

(86) PCT No.: PCT/JP2020/043273
§ 371 (c)(1),
(2) Date: Jun. 17, 2022

(87) PCT Pub. No.: WO2021/124790
PCT Pub. Date: Jun. 24, 2021

(65) Prior Publication Data
US 2023/0030335 A1 Feb. 2, 2023

(30) Foreign Application Priority Data
Dec. 20, 2019 (JP) .................. 2019-230925

(51) Int. Cl.
*H01S 3/13* (2006.01)
*G01C 19/72* (2006.01)
(Continued)

(52) U.S. Cl.
CPC .......... *H01S 3/1303* (2013.01); *G01C 19/721* (2013.01); *G02F 1/39* (2013.01);
(Continued)

(58) Field of Classification Search
CPC ... H01S 3/1303; H01S 5/0687; G01C 19/721; G01C 19/723; G01C 19/72; G02F 1/39; G02F 1/37; G02F 2203/56
See application file for complete search history.

(56) References Cited

U.S. PATENT DOCUMENTS 10,337,867 B1    7/2019  Dimashkie et al.
2011/0255094 A1* 10/2011 Mohageg ............... G01C 19/72
                                                        356/461
(Continued)

FOREIGN PATENT DOCUMENTS

JP    H03-155686 A    7/1991
JP    H07-324938 A    12/1995
(Continued)

OTHER PUBLICATIONS

International Search Report (ISR) (PCT Form PCT/ISA/210), in PCT/JP2020/043273, dated Feb. 16, 2021.

*Primary Examiner* — Tarifur R Chowdhury
*Assistant Examiner* — Joshua M Carlson
(74) *Attorney, Agent, or Firm* — McGinn Intellectual Propoerty Law Group, PLLC

(57) ABSTRACT

To provide a light source device for a fiber optic gyroscope capable of broadening the bandwidth of the laser light and improving stability of a scale factor.
A light source device for a fiber optic gyroscope configured to drive a fiber optic gyroscope includes: a laser light source 10, a stabilizing part 20, and a bandwidth broadening part 30. The laser light source 10 emits a laser light of a predetermined frequency. The stabilizing part 20 stabilizes the predetermined frequency of the laser light emitted from the laser light source 10. The bandwidth broadening part 30 makes the laser light stabilized by the stabilizing part 20 into a light having a continuous broadband spectrum.

12 Claims, 4 Drawing Sheets

(51) Int. Cl.
*G02F 1/37* (2006.01)
*G02F 1/39* (2006.01)
*H01S 5/0687* (2006.01)

(52) U.S. Cl.
CPC .............. *H01S 5/0687* (2013.01); *G02F 1/37* (2013.01); *G02F 2203/56* (2013.01)

(56) References Cited

U.S. PATENT DOCUMENTS

| | | | |
|---|---|---|---|
| 2016/0003619 | A1 | 1/2016 | Strandjord et al. |
| 2018/0080770 | A1* | 3/2018 | Chamoun ............. G02F 1/0121 |
| 2019/0103722 | A1* | 4/2019 | Kieu ................... H01S 3/06791 |
| 2019/0129276 | A1 | 5/2019 | Del Bino et al. |
| 2019/0331492 | A1 | 10/2019 | Ducloux |
| 2020/0076149 | A1* | 3/2020 | Papp ..................... G02F 1/0344 |
| 2020/0409232 | A1* | 12/2020 | Weiner ...................... G02F 3/00 |
| 2021/0026223 | A1* | 1/2021 | Stern ....................... H01S 5/142 |

FOREIGN PATENT DOCUMENTS

| | | |
|---|---|---|
| JP | 2005-172651 A | 6/2005 |
| JP | 2016-017957 A | 2/2016 |
| JP | 2019-522218 A | 8/2019 |
| JP | 2019-522817 A | 8/2019 |
| JP | 2019-184599 A | 10/2019 |
| JP | 2019-529881 A | 10/2019 |

* cited by examiner ic device for a fiber optic gyroscope and a fiber optic gyroscope using the same, and more particularly to a light source device for a fiber optic gyroscope capable of enhance the stability of a scale factor and a fiber optic gyroscope using the same.

LIGHT SOURCE DEVICE FOR FIBER OPTIC GYROSCOPE AND FIBER OPTIC GYROSCOPE USING THE SAME

TECHNICAL FIELD

The present invention relates to a light source device for a fiber optic gyroscope and a fiber optic gyroscope using the same, and more particularly to a light source device for a fiber optic gyroscope capable of enhance the stability of a scale factor and a fiber optic gyroscope using the same.

BACKGROUND ART

Along with the recent rapid development of automatic control and autonomous navigation technologies, a demand for improving in accuracy of the current position of a moving body has been increasing every year. As the autonomous navigation technology, a GNSS (Global Navigation Satellite System) and an INS (Inertial Navigation System) are known.

As a sensor for use in the INS, a fiber optic gyroscope (FOG) is known (see, for example, Patent Document 1). The fiber optic gyroscope is a rotation angular velocity sensor utilizing the Sagnac effect of light. The fiber optic gyroscope uses a fiber optic coil and has advantages of having no moving element, being smaller in size than conventional mechanical gyros, and being maintenance free and thus has attracted attention.

A phase difference $\Delta\phi$ generated according to the rotation angular velocity of the fiber optic gyroscope is calculated by multiplying an angular velocity $\Omega$ by a scale factor (SF) as a coefficient. That is, the coefficient of the angular velocity $\Omega$ in the right side of the below described equation for the phase difference $\Delta\phi$ is called as a scale factor.

$$\Delta\Phi = \frac{8\pi^2 R^2 N}{c\lambda}\Omega \quad \text{[Numeral 1]}$$

Wherein, R is the radius of the fiber optic coil, N is the number of turns of the fiber optic coil, $\lambda$ is the wavelength, and c is the light speed.

The scale factor corresponds to the ratio between angular velocity and an output signal and, as understood from Numeral 1, the scale factor is subject to variations in wavelength $\lambda$. Unless the scale factor is temporally stabilized, the phase difference fluctuates even under a constant angular velocity, resulting in fluctuation of a sensor output. As a result, no matter how high sensitivity (output signal) is, the Allan deviation which is the index of the accuracy of the gyroscope deteriorates as the time elapses. Thus, to improve the Allan deviation, it is necessary to enhance the stability of the scale factor.

There is, for example, Patent Document 2 as a stabilized light source for driving a fiber optic gyroscope. The purpose of Patent Document 2 is to solve spectral asymmetry between orthogonal axes of wavelength that may cause instability of the scale factor. Patent Document 2 relates to a symmetrical wavelength multiplexor configured to mitigate the spectral asymmetry between orthogonal axes of wavelength so as to reduce scale factor errors.

Further, as a sensor similar to the fiber optic gyroscope, a ring laser gyroscope is known (see, for example, Patent Document 3).

CITATION LIST

Patent Document

Patent Document 1: JP 2005-172651A
Patent Document 2: JP 2019-184599A
Patent Document 3: JP 03-155686A

DISCLOSURE OF THE INVENTION

Problems to be Solved by the Invention

As described above, it is necessary to enhance stability of the scale factor in order to improve the accuracy of the gyroscope. However, a fiber optic gyroscope like the one disclosed in Patent Document 1 has a scale factor with low stability.

Further, a stabilized light source like the one disclosed in Patent Document 2 has a good scale factor stability but has a narrow laser light bandwidth, so that when used as a light source for a fiber optic gyroscope, performance degradation due to such as light backscattering and polarization coupling, in the fiber optic coil cannot be avoided. To avoid such light backscattering or polarization coupling in the fiber optic coil, a broadband laser light needs to be used; in this case, however, the center frequency (center wavelength) is not stabilized to result in instability of the scale factor.

Further, a ring laser gyroscope like the one disclosed in Patent Document 3 has a good and highly accurate Allan deviation to a certain degree but is large in size and expensive. Further, there is also a demand for gyroscopes with higher accuracy.

In view of the above situations, an object of the present invention is to provide a light source device for a fiber optic gyroscope capable of broadening the bandwidth of a laser light and improving the stability of a scale factor and a fiber optic gyroscope using the same.

Means for Solving the Problems

To attain the above object of the present invention, a light source device for a fiber optic gyroscope according to the present invention may include: a laser light source that emits a laser light of a predetermined frequency; a stabilizing part that stabilizes the predetermined frequency of the laser light emitted from the laser light source; and a bandwidth broadening part that makes the laser light stabilized by the stabilizing part into a light having a continuous broadband spectrum.

The stabilizing part may lock the laser light emitted from the laser light source to a reference frequency source for stabilization.

The laser light source may be a continuous laser light source that emits a continuous light.

The laser light source may be a pulse laser light source that emits a light of pulse-like spectra equally spaced at predetermined intervals.

In this case, the bandwidth broadening part may include a white noise modulation part to which the laser light stabilized by the stabilizing part is inputted and which performs frequency modulation using white noise for making a continuous spectrum with a modulation width equal to or more than a predetermined interval of the pulse-like spectra.

Further, the bandwidth broadening part may include an optical comb generation part to which the laser light stabilized by the stabilizing part is inputted and which emits a light having a plurality of spectra equally spaced at predetermined intervals with a predetermined frequency as a center; and a white noise modulation part to which the light emitted from the optical comb generation part is inputted and which performs frequency modulation using white noise for making a continuous spectrum with a modulation width equal to or more than a predetermined interval of a plurality of spectra.

Further, the bandwidth broadening part may include a white noise modulation part to which the laser light stabilized by the stabilizing part is inputted and which performs frequency modulation using white noise for making a continuous spectrum with a predetermined modulation width; and an optical comb generation part to which the light emitted from the white noise modulation part is inputted and which emits a light having a plurality of spectra equally spaced at predetermined intervals that is equal to or less than a predetermined modulation width by using white noise, with a predetermined frequency as a center.

Further, the bandwidth broadening part may include a parametric down-conversion part that emits a photon pair using the laser light stabilized by the stabilizing part as excitation light.

Further, the bandwidth broadening part may include an optical comb generation part to which the laser light stabilized by the stabilizing part is inputted and which emits a light having a plurality of spectra equally spaced at predetermined intervals with a predetermined frequency as a center; and a parametric down-conversion part that emits a photon pair using the light emitted from the optical comb generation part as excitation light.

A fiber optic gyroscope according to the present invention using the above light source device for a fiber optic gyroscope includes: an optical circulator that separates between the light having a continuous broadband spectrum from the bandwidth broadening part and an interference light obtained by recombining a counterclockwise light and a clockwise light that have passed through a fiber optic coil; a multifunctional integrated optical circuit including a polarizer to which the light having a continuous broadband spectrum is inputted from the bandwidth broadening part through the optical circulator and which allows a single polarized light to pass therethrough, a Y-branch/recombiner that branches the light from the polarizer and makes the resultant lights enter both ends of the fiber optic coil and recombines counterclockwise light and clockwise light that have passed through the fiber optic coil as interference light, a first phase modulator that modulates the light to enter one end of the fiber optic coil, and a second phase modulator that modulates the light to enter the other end of the fiber optic coil; a phase modulation signal generator that generates, in order to reduce thermal phase noise, a phase modulation signal for performing phase modulation at integral multiples of an eigenfrequency of the fiber optic coil to the first and second phase modulators; an optical detector to which the interference light obtained by recombining the counterclockwise light and clockwise light that have passed through the fiber optic coil is inputted from the optical circulator and which detects a light intensity signal of the interference light; and a synchronous detector that uses the phase modulation signal from the phase modulation signal generator as a reference signal to synchronously detect the light intensity signal detected by the optical detector and outputs the detected light intensity signal as a detection signal of input angular velocity to the fiber optic coil.

Further, a fiber optic gyroscope according to the present invention using the above light source device for a fiber optic gyroscope includes: an optical circulator that separates between the light having a continuous broadband spectrum from the bandwidth broadening part and interference a light obtained by recombining a counterclockwise light and a clockwise light that have passed through a fiber optic coil; a multifunctional integrated optical circuit including a polarizer to which the light having a continuous broadband spectrum is inputted from the bandwidth broadening part through the optical circulator and which allows a single polarized light to pass therethrough, a Y-branch/recombiner that branches the light from the polarizer and makes the resultant lights enter both ends of the fiber optic coil and recombines counterclockwise light and clockwise light that have passed through the fiber optic coil as interference light, a first phase modulator that modulates the light to enter one end of the fiber optic coil, and a second phase modulator that modulates the light to enter the other end of the fiber optic coil; a phase modulation signal generator that generates, in order to reduce relative intensity noise, a phase modulation signal for performing phase modulation at odd multiples of an eigenfrequency of the fiber optic coil to the first and second phase modulators; an optical detector to which the interference light obtained by recombining the counterclockwise light and clockwise light that have passed through the fiber optic coil is inputted from the optical circulator and which detects a light intensity signal of the interference signal; a reference light detector that detects a reference light intensity signal of light having a continuous broadband spectrum from the bandwidth broadening part; and a synchronous detector that uses the phase modulation signal from the phase modulation signal generator as a reference signal to synchronously detect a sum signal of the light intensity signal detected by the optical detector and the reference light intensity signal output from the reference light detector and outputs the detected sum signal as a detection signal of input angular velocity to the fiber optic coil.

Further, a fiber optic gyroscope according to the present invention using the above light source device for a fiber optic gyroscope includes: an optical circulator that separates between the light having a continuous broadband spectrum from the bandwidth broadening part and an interference light obtained by recombining a counterclockwise light and a clockwise light that have passed through a fiber optic coil; a multifunctional integrated optical circuit including a polarizer to which the light having a continuous broadband spectrum is inputted from the bandwidth broadening part through the optical circulator and which allows a single polarized light to pass therethrough, a Y-branch/recombiner that branches the light from the polarizer and makes the resultant lights enter both ends of the fiber optic coil and recombines counterclockwise light and clockwise light that have passed through the fiber optic coil as interference light, a first phase modulator that modulates the light to enter one end of the fiber optic coil, and a second phase modulator that modulates the light to enter the other end of the fiber optic coil; a phase modulation signal generator that generates, in order to reduce relative intensity noise, a phase modulation signal for performing phase modulation at even multiples of an eigenfrequency of the fiber optic coil to the first and second phase modulators; an optical detector to which the interference light obtained by recombining the counterclockwise light and clockwise light that have passed through the fiber optic coil is inputted from the optical circulator and which detects a light intensity signal of the interference light; a reference light detector that detects a reference light intensity signal of light having a continuous broadband spectrum from the bandwidth broadening part; and a synchronous detector that uses the phase modulation signal from the phase modulation signal generator as a reference signal to synchronously detect a difference signal between the light intensity signal detected by the optical detector and the reference light intensity signal detected by the reference light detector and outputs the detected difference signal as a detection signal of input angular velocity to the fiber optic coil.

The phase modulation signal generator generates, in order to reduce thermal phase noise and relative phase noise, a phase modulation signal for performing phase modulation at integral multiples of the eigenfrequency of the fiber optic coil to the first and second phase modulators of the multifunctional integrated optical circuit.

Here, the synchronous detector may synchronously detect a phase modulation signal from the phase modulation signal generator, whereby the synchronous detector further outputs a signal canceling a phase difference between the counterclockwise light and the clockwise light generated by input angular velocity to the fiber optic coil, to the phase modulation signal generator, as a feedback control signal for feedback control of the phase modulation signal generator.

Advantageous Effects of the Invention

The light source device for a fiber optic gyroscope according to the present invention has advantages of being capable of broadening the bandwidth of the laser light and enhancing stability of the scale factor.

BEST MODE FOR CARRYING OUT THE INVENTION

Hereinafter, embodiments for practicing the present invention will be described with illustrated examples. A light source device for a fiber optic gyroscope according to the present invention is a device for driving a fiber optic gyroscope 1 having a fiber optic coil. The fiber optic gyroscope 1 is a sensor utilizing the Sagnac effect. The Sagnac effect is a phenomenon in which the length of an optical path appears to change due to movement of the fiber optic coil as the optical path. The fiber optic gyroscope 1 uses a fiber optic coil having a length of, for example, 1 km. The fiber optic gyroscope 1 to be driven is not particularly limited in structure, and the light source device for a fiber optic gyroscope according to the present invention can drive any existing or future fiber optic gyroscope.

Figure 1:
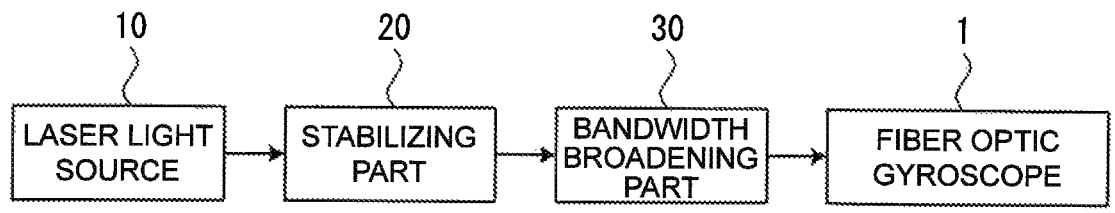
FIG. 1 is a schematic block diagram for explaining the configuration of a light source device for a fiber optic gyroscope according to the present invention.

FIG. 1 is a schematic block diagram for explaining the configuration of the light source device for a fiber optic gyroscope according to the present invention. As illustrated, the light source device for a fiber optic gyroscope according to the present invention is mainly constituted by a laser light source 10, a stabilizing part 20, and a bandwidth broadening part 30. That is, the light source device for a fiber optic gyroscope according to the present invention uses the stabilizing part 20 to stabilize the laser light from the laser light source 10, uses the bandwidth broadening part 30 to broaden the bandwidth of the laser light, and drives the fiber optic gyroscope 1. The following describes in detail the configurations of the above constituent elements.

The laser light source 10 emits a laser light of a predetermined frequency. The laser light from the laser light source 10 may be a continuous wave (CW) light. For example, a semiconductor laser, a solid-state laser, a gas laser, and a dye laser, etc. are available as the laser light source 10. The wavelength of the laser light emitted from the laser light source 10 is not limited to a specific one. That is, the laser light source 10 may emit at least a laser light of a 1560 nm wavelength at which light propagation loss of the optical fiber is small or a 780 nm wavelength which is the second harmonic thereof.

Incidentally, the laser light source of the light source device for a fiber optic gyroscope according to the present invention is not limited to a continuous wave laser light source and may be a pulse laser light source that emits a light of pulse-like spectra equally spaced at predetermined intervals. A specific example may be an optical comb light source.

The stabilizing part 20 stabilizes a predetermined frequency (wavelength) of the laser light emitted from the laser light source 10. In the light source device for a fiber optic gyroscope according to the present invention, the stabilizing part 20 may lock the laser light emitted from the laser light source 10 to a reference frequency source for stabilization. Specifically, when the predetermined frequency is a 1560 nm wavelength, the laser light may be stabilized with the stability of frequency in the order of kHz or MHz (up to about 0.001 ppm). The frequency spectral line width of the laser light is originally narrow to a certain degree, so that the stabilizing part 20 of the light source device for a fiber optic gyroscope according to the present invention may enhance the long-term frequency stability (i.e., relatively slow fluctuation) of the laser light. Therefore, it is not always necessary to reduce short-term phase noise and the like with high accuracy so as to narrow the frequency spectral line width. The configuration of the stabilizing part 20 will be described later more specifically.

The bandwidth broadening part 30 makes the laser light stabilized by the stabilizing part 20 into a light having a continuous broadband spectrum. The bandwidth broadening part 30 may function to convert the laser light into, for example, light having a plurality of spectra continuously arranged with equally spaced at predetermined intervals with a predetermined frequency as a center. Specifically, when the predetermined frequency is a 1560 nm wavelength, a frequency band is broadened in THz order (nm order in wavelength). The resultant light is a light having continuous broadband spectrum obtained by conversion based on the stabilized laser light, and thus the center frequency (center wavelength) thereof is also stabilized. Accordingly, the scale factor is also stabilized. The configuration of the bandwidth broadening part 30 will be described later more specifically.

With the thus configured light source device for a fiber optic gyroscope according to the present invention, the wavelength of the laser light is stabilized to thereby enhance the stability of the scale factor. Then, the laser light can be broadened in bandwidth with the stabilized scale factor, so that it is possible to avoid performance degradation due to such as light backscattering and polarization coupling in the fiber optic coil.

Figure 2:
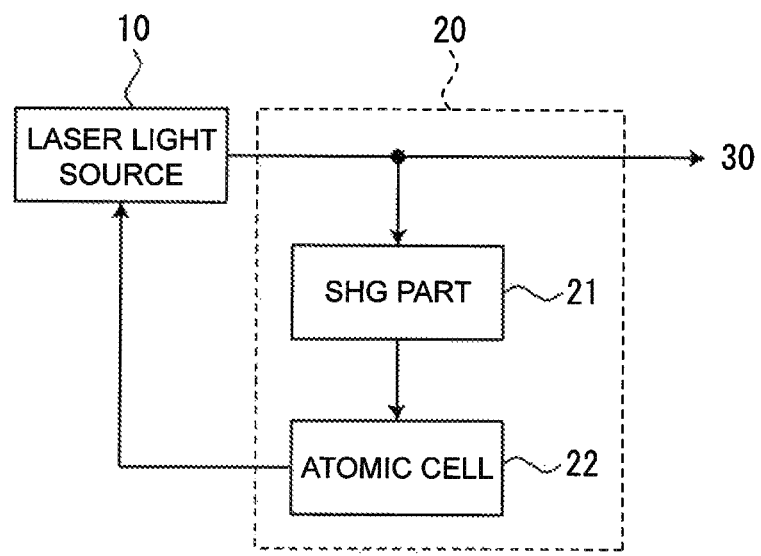
FIG. 2 is a schematic block diagram for explaining a specific example of a stabilizing part of the light source device for a fiber optic gyroscope according to the present invention.
Figure 3A:
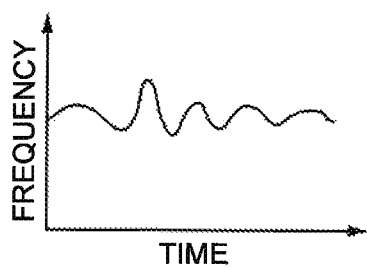
FIG. 3 is a graph schematically illustrating a state where the frequency of the laser light is stabilized by the stabilizing part of the light source device for a fiber optic gyroscope according to the present invention.
Figure 3B:
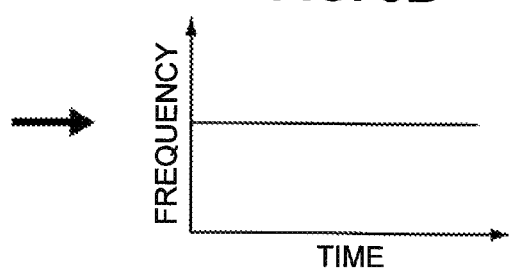

Next, a specific example of the stabilizing part of the light source device for a fiber optic gyroscope according to the present invention is described. FIG. 2 is a schematic block diagram for explaining a specific example of the stabilizing part of the light source device for a fiber optic gyroscope according to the present invention. In the drawing, the same reference numerals as those in FIG. 1 denote the same parts. FIG. 3 is graphs schematically illustrating a state where the frequency of the laser light is stabilized by the stabilizing part of the light source device for a fiber optic gyroscope according to the present invention; FIG. 3A illustrating frequency characteristics with respect to the time before stabilization, and FIG. 3B illustrating frequency characteristics with respect to the time after stabilization. As illustrated in FIG. 2, the stabilizing part 20 serves as a feedback circuit for locking the laser light emitted from the laser light source 10 to a reference frequency source for stabilization. The illustrated feedback circuit uses a second harmonic generation (SHG) part 21 to convert the wavelength into ½ of the original frequency and then locks the resultant laser light to an atomic cell 22 as the reference frequency source, followed by feedback to the laser light source 10. The SHG part 21 may be a nonlinear crystal that converts the wavelength into, for example, ½ of the original frequency. The atomic cell 22 may be a cell enclosing a rubidium (Rb) atomic gas, when, for example, a wavelength of 780 nm is used.

Specifically, as the laser light source 10, a semiconductor laser light source that outputs a continuous wave (CW) light of a 1560 nm wavelength is used. The frequency characteristics of the laser light from the semiconductor laser light source is illustrated in FIG. 3A. As illustrated, the laser light from the semiconductor laser light source relatively slowly fluctuates in frequency. The wavelength of this laser light is converted into 780 nm by the SHG part 21. The resultant laser light of 780 nm is made to pass through the atomic cell 22 enclosing the Rb atomic gas to be separated using various absorption spectroscopy methods such as linear absorption spectroscopy and saturated absorption spectroscopy. The spectra thus obtained are used to perform feedback to the semiconductor laser light source. This stabilizes the frequency of the laser light from the laser light source 10 by means of the Rb atoms of the atomic cell 22 as the reference frequency source. That is, as illustrated in FIG. 3B, long-term frequency stability is enhanced.

Incidentally, the stabilizing part 20 of the light source device for a fiber optic gyroscope according to the present invention is not limited to the one that uses the above SHG and atomic spectroscopy. For example, absorption lines for molecules such as $C_2H_2$ and HCN exist around 1560 nm, so that it is also possible to stabilize the frequency of the laser light from the laser light source 10 by using a glass cell enclosing these molecular gases to separate the laser light of a 1560 nm wavelength according to various absorption spectroscopy methods such as linear absorption spectroscopy and saturated absorption spectroscopy. That is, the stabilizing part 20 may stabilize the frequency of the laser light by separating the laser light using one enclosing, in a glass cell, atoms or molecules for which the absorption lines exist in a desired frequency band as the reference frequency source.

Besides, an optical resonator is applicable as the stabilizing part 20. That is a Fabry-Perot optical resonator constituted by two mutually facing mirrors. This optical resonator resonates with a light of a specific frequency, so that feedback is performed using the optical resonator as the reference frequency source to lock the frequency of the light. Thus, any existing or future type as long as it can stabilize a predetermined frequency of the inputted laser light are applicable as the stabilizing part 20 of the light source device for a fiber optic gyroscope according to the present invention.

Figure 4:
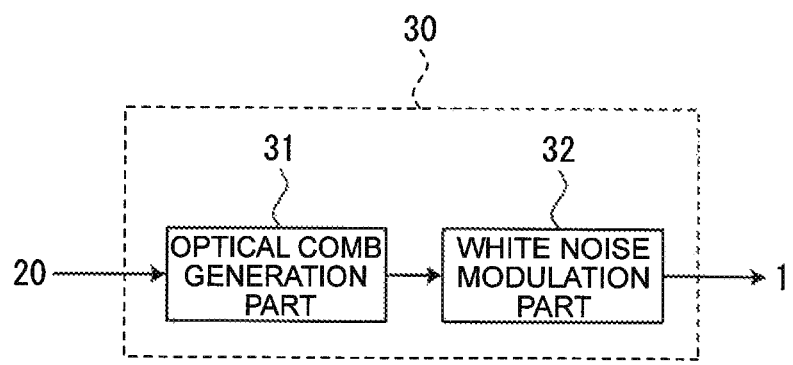
FIG. 4 is a schematic block diagram for explaining a specific example of a bandwidth broadening part of the light source device for a fiber optic gyroscope according to the present invention.
Figure 5A:
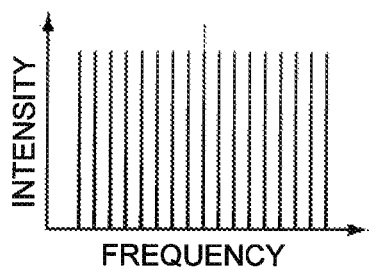
FIG. 5 is a graph schematically illustrating the frequency spectrum of the laser light processed by a bandwidth broadening part of the light source device for a fiber optic gyroscope according to the present invention.
Figure 5B:
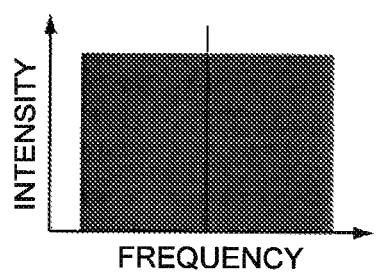

Next, a specific example of the bandwidth broadening part of the light source device for a fiber optic gyroscope according to the present invention is described. FIG. 4 is a schematic block diagram for explaining a specific example of the bandwidth broadening part of the light source device for a fiber optic gyroscope according to the present invention. In the drawing, the same reference numerals as those in FIG. 1 denote the same parts. FIG. 5 is graphs schematically illustrating the frequency spectrum of the laser light processed by the bandwidth broadening part of the light source device for a fiber optic gyroscope according to the present invention; FIG. 5A illustrating a frequency spectrum in an output from an optical comb generation part, and FIG. 5B illustrating a frequency spectrum in an output from a white noise modulation part. The bandwidth broadening part 30 makes the laser light stabilized by the stabilizing part 20 have a broadband spectrum and a continuous spectrum.

In the example illustrated in FIG. 4, the bandwidth broadening part 30 is constituted by an optical comb generation part 31 and a white noise modulation part 32. The optical comb generation part 31 is to which the laser light stabilized by the stabilizing part 20 is inputted, and emits a light having a plurality of spectra equally spaced at predetermined intervals with a predetermined frequency as a center. That is, when the stabilized laser light is inputted, the optical comb generation part 31 outputs light having a plurality of highly stable spectra equally spaced intervals on the left and right sides with a predetermined frequency as a center, as illustrated in FIG. 5A. Since the laser light stabilized in frequency is inputted, the spectra of the generated optical comb are also highly stabilized. Incidentally, any existing or future type as long as it can generate an optical comb are applicable as the optical comb generation part 31.

The white noise modulation part 32 is to which the light emitted from the optical comb generation part 31 is inputted, and performs frequency modulation using white noise for making a continuous spectrum with a modulation width equal to or more than a predetermined interval of a plurality of spectra. That is, when an optical comb having stabilized spectra as illustrated in FIG. 5A is inputted, the white noise modulation part 32 performs frequency modulation with white noise so as to fill the interval between the plurality of spectra to obtain a continuous spectrum (uniform spectrum) as illustrated in FIG. 5B. Thus, the white noise modulation part 32 can generate a light of a continuous spectrum over a broad bandwidth. Incidentally, any existing or future type as long as it can perform frequency modulation using white noise are applicable as the white noise modulation part 32.

As described above, in the light source device for a fiber optic gyroscope according to the present invention, the spectra of the optical comb are highly stabilized, and a predetermined frequency (wavelength) is kept stable. Specifically, when a predetermined frequency is a 1560 nm wavelength, the laser light is stabilized with the stability of frequency in the order of kHz or MHz (up to about 0.001 ppm). As a result, the stability of the scale factor is enhanced. Then, in a state where the stability of the scale factor is enhanced, the stabilized laser light is spread by the optical comb such that a plurality of spectra is continuously arranged at even intervals over a broad bandwidth, and the plurality of spectra is made into a continuous spectrum by white noise, with the result that the light is broadened in bandwidth. Specifically, when the frequency of the laser light from the laser light source 10 is a 1560 nm wavelength, for example, the frequency band is broadened in the order of THz (nm order in wavelength). Thus, the light source device for a fiber optic gyroscope according to the present invention can improve the scale factor while preventing performance degradation due to such as light backscattering and polarization coupling in the fiber optic coil.

Figure 6:
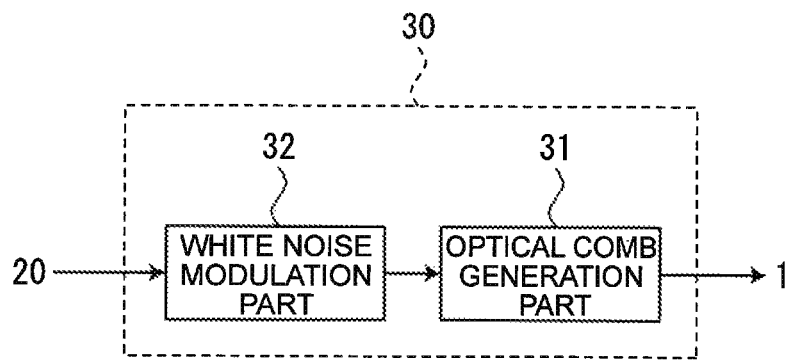
FIG. 6 is a schematic block diagram for explaining another specific example of the bandwidth broadening part of the light source device for a fiber optic gyroscope according to the present invention.
Figure 7A:
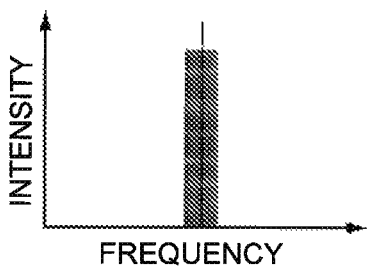
FIG. 7 is a graph schematically illustrating the frequency spectrum of the laser light processed by the bandwidth broadening part of the light source device for a fiber optic gyroscope according to the present invention.
Figure 7B:
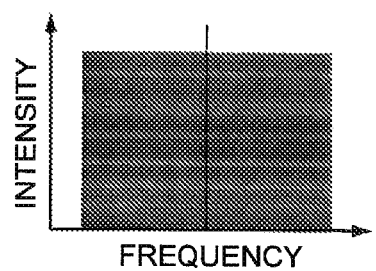

Incidentally, in the example illustrated in FIG. 4, the optical comb is generated, and then a uniform spectrum is obtained using white noise; however, the present invention is not limited to this. FIG. 6 is a schematic block diagram for explaining another specific example of the bandwidth broadening part of the light source device for a fiber optic gyroscope according to the present invention. In the drawing, the same reference numerals as those in FIG. 4 denote the same parts. FIG. 7 is graphs schematically illustrating the frequency spectrum of the laser light processed by the bandwidth broadening part of the light source device for a fiber optic gyroscope according to the present invention; FIG. 7A illustrating a frequency spectrum in an output from the white noise modulation part, and FIG. 7B illustrating a frequency spectrum in an output from the optical comb generation part. In the example illustrated in FIG. 6, contrary to the example illustrated in FIG. 4, frequency modulation is performed by the white noise modulation part 32 first, and then a plurality of spectrization is performed by the optical comb generation part 31. That is, the bandwidth broadening part 30 is constituted by the white noise modulation part 32 and optical comb generation part 31. The white noise modulation part 32 is to which the laser light stabilized by the stabilizing part 20 is inputted, and performs frequency modulation using white noise for making a continuous spectrum with a predetermined modulation width. That is, when the stabilized laser light is inputted, the white noise modulation part 32 performs frequency modulation using white noise for making a continuous spectrum as illustrated in FIG. 7A with a predetermined modulation width thereby achieving a continuous spectrum (uniform spectrum) having a predetermined modulation width.

And the optical comb generation part 31 is to which the light emitted from the white noise modulation part 32 is inputted, and emits a light having a plurality of spectra equally spaced at predetermined intervals that is equal to or less than a predetermined modulation width by using white noise, with a predetermined frequency as a center. That is, when the laser light having a continuous spectrum with a predetermined modulation width as illustrated in FIG. 7A is inputted, the optical comb generation part 31 outputs light having a plurality of spectra equally spaced intervals on the left and right sides with a predetermined frequency of the inputted laser light as a center, as illustrated in FIG. 7B. As a result, as in the example illustrated in FIG. 4, it is possible to generate light of a continuous spectrum over a broad bandwidth.

Figure 8:
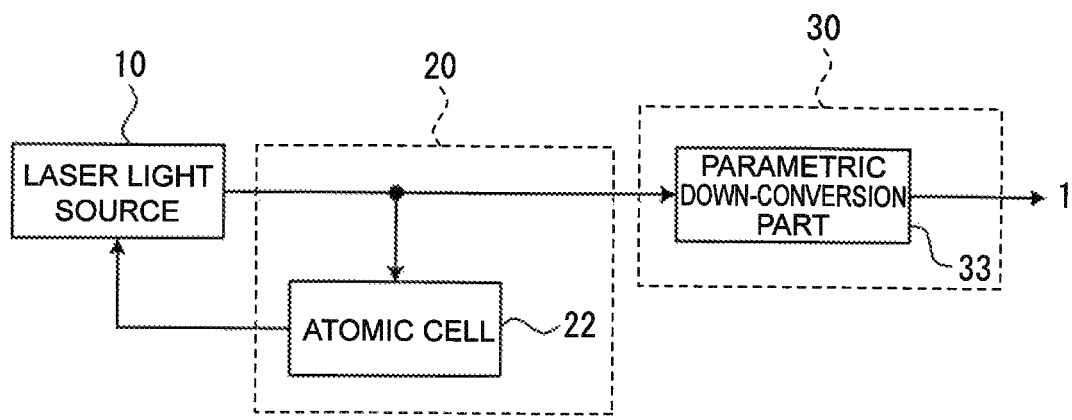
FIG. 8 is a schematic block diagram for explaining another specific example of the light source device for a fiber optic gyroscope according to the present invention.

Next, another specific example of the light source device for a fiber optic gyroscope according to the present invention is described using FIG. 8. FIG. 8 is a schematic block diagram for explaining another example of the light source device for a fiber optic gyroscope according to the present invention. In the drawing, the same reference numerals as those in FIG. 1 denote the same parts. The illustrated bandwidth broadening part 30 is constituted by a parametric down-conversion part 33. The parametric down-conversion part 33 uses a nonlinear optical crystal and emits a photon pair using the laser light stabilized by the stabilizing part 20 as excitation light. Here, a specific description will be made of a case where the output frequency of the light source device for a fiber optic gyroscope according to the present invention is set to 1560 nm at which the propagation loss of an optical fiber is small. As the laser light source 10, a semiconductor laser that can emit a laser light of 780 nm is used. In this case, the stabilizing part 20 may perform feedback using only the atomic cell 22. That is, an absorption spectroscopy method, etc. is used to lock the 780 nm light to the atomic cell 22 enclosing an Rb atomic gas, and the obtained spectrum is used to perform feedback to the semiconductor laser.

The thus stabilized laser light is inputted to the parametric down-conversion part 33. The parametric down-conversion part 33 generates a photon pair with the stabilized laser light as excitation light. That is, the laser light inputted to the parametric down-conversion part 33 has a continuous spectrum (uniform spectrum) spreading to the left and right with ½ frequency (twice in wavelength) of a predetermined frequency of the inputted laser light. Specifically, when a light of stabilized wavelength of 780 nm is inputted to the parametric down-conversion part 33, the frequency band of the laser light of 1560 nm wavelength is broadened in the order of THz (nm order in wavelength). This allows light having a continuous broadband spectrum to be obtained.

Incidentally, when the parametric down-conversion part 33 as illustrated in FIG. 8 is used, the laser light source 10 may be a continuous laser light source that emits a continuous light and may alternatively be a pulse laser light source that emits a light of pulse-like spectra equally spaced at predetermined intervals. In the similar manner to the continuous light, a pulse laser light is locked to a predetermined frequency by the stabilizing part 20 for stabilization, whereby the pulse-like spectra are each stabilized.

Also, when the pulse laser light source that emits a light of pulse-like spectra is used as the laser light source 10 in the light source device for a fiber optic gyroscope according to the present invention, the bandwidth broadening part 30 is not limited to the parametric down-conversion part 33 illustrated in FIG. 8. That is, in place of the parametric down-conversion part 33, the white noise modulation part 32 may be used as the bandwidth broadening part 30. The pulse-like spectra equally spaced at predetermined intervals from the pulse laser light source are stabilized by the stabilizing part 20 and inputted to the white noise modulation part 32. Then, the white noise modulation part 32 uses white noise to perform frequency modulation with a modulation width equal to or more than a predetermined interval of pulse-like spectra to obtain a continuous spectrum (uniform spectrum).

Figure 9:
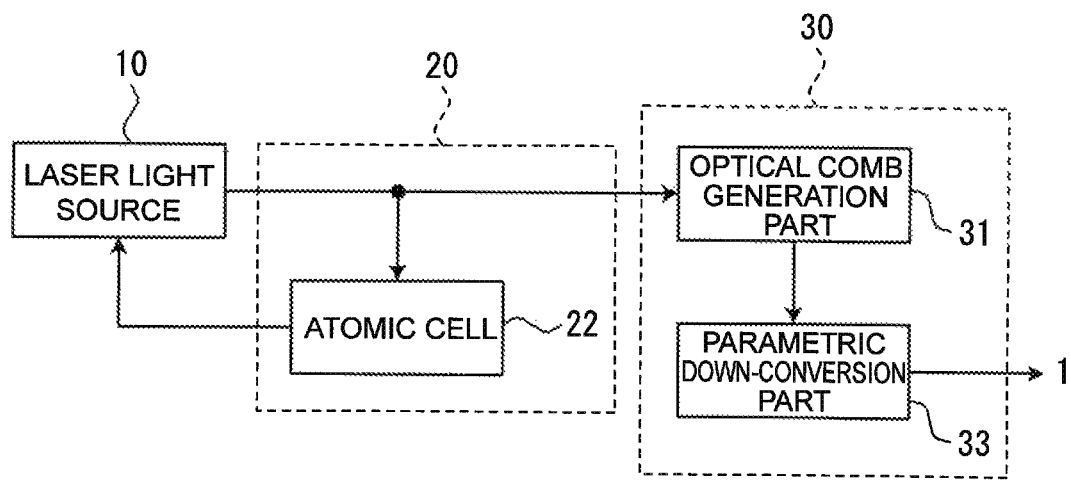
FIG. 9 is a schematic block diagram for explaining still another example of the light source device for a fiber optic gyroscope according to the present invention.

Further, using FIG. 9, still another specific example of the light source device for a fiber optic gyroscope according to the present invention is described. FIG. 9 is a schematic block diagram for explaining still another example of the light source device for a fiber optic gyroscope according to the present invention. In the drawing, the same reference numerals as those in FIG. 1 denote the same parts. The illustrated bandwidth broadening part 30 is constituted by the optical comb generation part 31 and parametric down-conversion part 33. That is, the bandwidth broadening part 30 has a configuration combining the optical comb generation part 31 illustrated in FIG. 4 and the parametric down-conversion part 33 illustrated in FIG. 8. A specific description will be made of a case where the output frequency of the light source device for a fiber optic gyroscope according to the present invention is 1560 nm at which the propagation loss of an optical fiber is small. As the laser light source 10, a semiconductor laser that can emit a laser light of 780 nm is used. In this case, the stabilizing part 20 may perform feedback using only the atomic cell 22. That is, an absorption spectroscopy method, etc. is used to lock the light of 780 nm of the laser light source 10 to the atomic cell 22 enclosing an Rb atomic gas, and the obtained spectrum is used to perform feedback to the semiconductor laser.

The thus stabilized laser light is inputted to the optical comb generation part 31. The optical comb generation part 31 emits a light having a plurality of spectra equally spaced intervals on the left and right sides with a predetermined frequency of the inputted stabilized laser light as a center. Then, the light of a plurality of spectra equally spaced intervals is inputted to the parametric down-conversion part 33, and the parametric down-conversion part 33 generates a photon pair with the stabilized laser light as excitation light. That is, the laser light inputted to the parametric down-conversion part 33 has a continuous spectrum (uniform spectrum) spreading to the left and right with ½ frequency (twice in wavelength) of a predetermined frequency of the inputted laser light. Specifically, when the 780 nm light of a plurality of spectra equally spaced intervals is inputted to the parametric down-conversion part 33, the frequency band of the laser light of 1560 nm wavelength is broadened in the order of THz (nm order in wavelength). This allows light having a continuous broadband spectrum to be obtained.

In the example illustrated in FIG. 9, the light is pulsed by the optical comb generation part 31, so that conversion efficiency by the parametric down-conversion part 33 is enhanced as compared to the example illustrated in FIG. 8.

Next, a fiber optic gyroscope suitable for the light source device for a fiber optic gyroscope according to the present invention. The light source device for a fiber optic gyroscope according to the present invention is not limited in use only to a specific fiber optic gyroscope but is versatile. However, when being used in combination of a fiber optic gyroscope to be described below, intensity noise associated with broadening of bandwidth can be reduced. In addition, thermal phase noise caused by heat of a fiber optic coil can be reduced.

As described above, according to the light source device for a fiber optic gyroscope of the present invention, light from a light source can be broadened in bandwidth, thereby allowing enhancement of stability of the scale factor. On the other hand, broadening of bandwidth may cause intensity noise due to mutual interference between lights of different frequencies. This noise is referred to as "RIN (Relative Intensity Noise)".

As a conventional technique to reduce RIN, there is a method in which two fiber optic coils having the same length are prepared, and a reference light is inputted to one of them to measure intensity noise to detect intensity correlation of a light source, based on which influence of RIN is reduced. This method uses two fiber optic coils having the same length and is thus costly. Further, it is difficult to prepare fiber optic coils having exactly the same characteristics.

As another conventional technique to reduce RIN, there is a method in which utilizing a fact that a light that has passed through a fiber optic coil is delayed more than a light that has not passed through the fiber optic coil by a time taken to propagate through the fiber optic coil, the intensities of the two lights are summed so as to reduce the intensity noise. The light source device for a fiber optic gyroscope according to the present invention can be applied to a fiber optic gyroscope having a configuration that can reduce RIN.

Also, the optical fiber of the fiber optic coil is formed of quartz, and the atoms constituting quartz are in thermal motion at room temperature. The thermal motion of the atoms causes a variation in the refractive index of the optical fiber, so that phase noise is superimposed on the light that has passed through the fiber optic coil. This noise is referred to as "Thermal Phase Noise".

The thermal phase noise has a property of being reduced when being subjected to phase modulation at integral multiples of an eigenfrequency of the fiber optic coil. Thus, when the light source device for a fiber optic gyroscope according to the present invention is applied to a fiber optic gyroscope having a configuration in which thermal phase noise is reduced by synchronously detecting a light intensity signal with a phase modulation signal as a reference signal, the thermal phase noise can be reduced.

Figure 10:
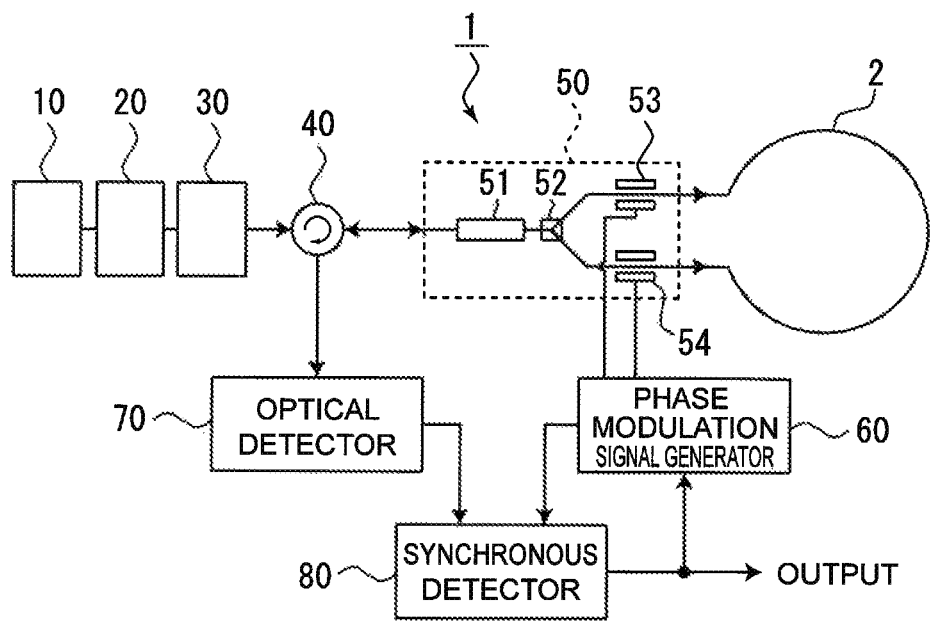
FIG. 10 is a schematic block diagram for explaining the configuration of a fiber optic gyroscope suitably using the light source device for a fiber optic gyroscope according to the present invention.

Hereinafter, a specific example of the fiber optic gyroscope suitably using the light source device for a fiber optic gyroscope according to the present invention is described. FIG. 10 is a schematic block diagram for explaining the configuration of a fiber optic gyroscope suitably using the light source device for a fiber optic gyroscope according to the present invention. In the drawing, the same reference numerals as those in FIG. 1, etc. denote the same parts. The fiber optic gyroscope in the illustrated example can reduce the thermal phase noise. As illustrated, a fiber optic gyroscope 1 uses, as a light source, the above-described light source device (10, 20, 30) for a fiber optic gyroscope according to the present invention. That is, the fiber optic gyroscope 1 is driven by using a light having a continuous broadband spectrum generated by the light source device for a fiber optic gyroscope according to the present invention. The fiber optic gyroscope 1 is mainly constituted by an optical circulator 40, a multifunctional integrated optical circuit 50, a phase modulation signal generator 60, an optical detector 70, and a synchronous detector 80. The multifunctional integrated optical circuit 50 is connected with a fiber optic coil 2.

The optical circulator 40 separates between the light having a continuous broadband spectrum from the bandwidth broadening part 30 and an interference light obtained by recombining a counterclockwise light and a clockwise light that have passed through the fiber optic coil 2. That is, the optical circulator 40 outputs the light from the bandwidth broadening part 30 to the multifunctional integrated optical circuit 50 to be described later and outputs the interference light returned thereto to the optical detector 70. In the drawing, the light having a continuous broadband spectrum from the bandwidth broadening part 30 enters the optical circulator 40 from the left side thereof and is outputted from the right side thereof. Then, the returned interference light obtained by recombining the counterclockwise light and clockwise light that have passed through the fiber optic coil 2 enters the optical circulator 40 from the right side thereof and is outputted downward therefrom to the optical detector 70 to be described later.

The multifunctional integrated optical circuit 50 is constituted by a polarizer 51, a Y-branch/recombiner 52, a first phase modulator 53, and a second phase modulator 54. The polarizer 51 receives the light having a continuous broadband spectrum from the bandwidth broadening part 30 through the optical circulator 40. Then, the polarizer 51 allows a single polarized light to pass therethrough. The Y-branch/recombiner 52 branches the light, i.e., the single polarized light, from the polarizer 51 and makes the resultant lights enter both ends of the fiber optic coil 2. The lights entering the both ends of the fiber optic coil 2 become the counterclockwise light and clockwise light, respectively. Then the Y-branch/recombiner 52 recombines the counterclockwise light and clockwise light that have passed through the fiber optic coil 2 and outputs the resultant light to the optical circulator 40 as an interference light. The first phase modulator 53 modulates one of the incident lights which enters one end of the fiber optic coil 2. For example, the light which becomes the clockwise light may be modulated. Also, the second phase modulator 54 modulates the other of the incident lights which enters the other end of the fiber optic coil 2. For example, the light which becomes the counterclockwise light light may be modulated.

The phase modulation signal generator 60 is configured to generate a phase modulation signal so as to reduce thermal phase noise. The phase modulation signal generator 60 outputs the phase modulation signal to the first phase modulator 53 and second phase modulator 54 of the multifunctional integrated optical circuit 50. The phase modulation signal generator 60 generates the phase modulation signal for the multifunctional integrated optical circuit 50 so as to perform phase modulation at integral multiples of the eigenfrequency of the fiber optic coil 2. Specifically, the phase modulation may be performed to be at integral multiples of about 10 to 100 times of the eigenfrequency. This can reduce thermal phase noise.

The optical detector 70, to which the interference light recombining the counterclockwise light and clockwise light that have passed through the fiber optic coil 2 from the optical circulator 40 is entered, detects the light intensity signal of the interference light.

The synchronous detector 80 uses the phase modulation signal from the phase modulation signal generator 60 as a reference signal to synchronously detect the light intensity signal detected by the optical detector 70 and outputs the detected light intensity signal as a detection signal of input angular velocity to the fiber optic coil 2.

The thus configured fiber optic gyroscope using the light source device for a fiber optic gyroscope according to the present invention performs phase modulation at integral multiples of the eigenfrequency of the fiber optic coil 2 to thereby make it possible to reduce thermal phase noise.

Figure 11:
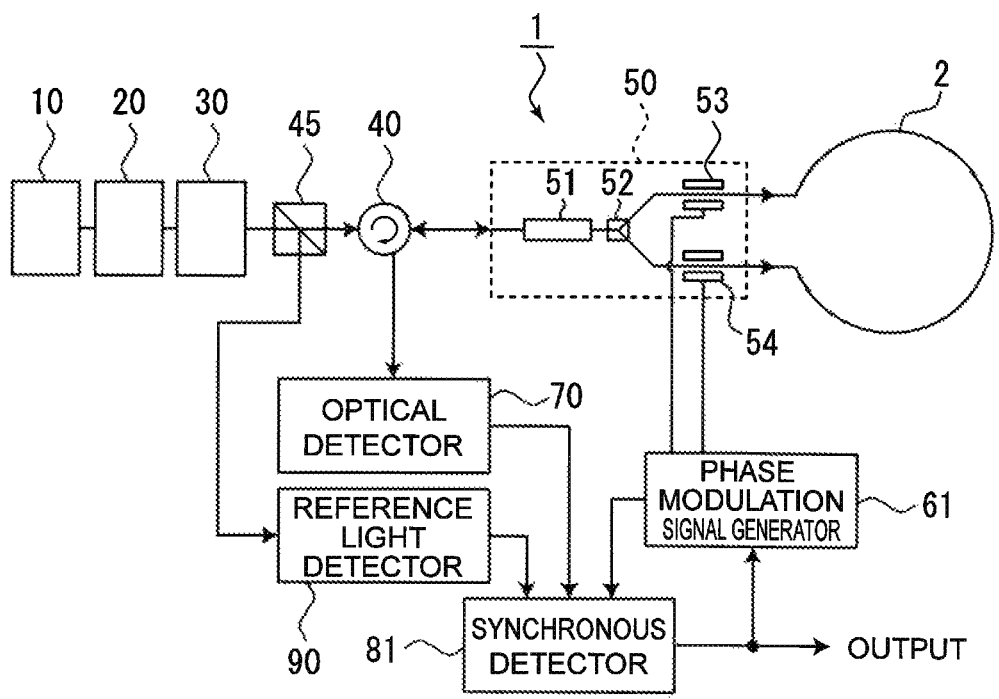
FIG. 11 is a schematic block diagram for explaining another configuration of a fiber optic gyroscope suitably using the light source device for a fiber optic gyroscope according to the present invention.

Next, another specific example of the fiber optic gyroscope suitably using the light source device for a fiber optic gyroscope according to the present invention is described. FIG. 11 is a schematic block diagram for explaining the configuration of a fiber optic gyroscope suitably using the light source device for a fiber optic gyroscope according to the present invention. In the drawing, the same reference numerals as those in FIG. 10 denote the same parts, and overlapping description will be omitted. The fiber optic gyroscope in the illustrated example can reduce relative intensity noise (RIN). As illustrated, also the fiber optic gyroscope 1 in this example is driven by using a light having a continuous broadband spectrum generated by the light source device (10, 20, 30) for a fiber optic gyroscope according to the present invention. The fiber optic gyroscope 1 is mainly constituted by the optical circulator 40, multifunctional integrated optical circuit 50, a phase modulation signal generator 61, optical detector 70, a synchronous detector 81, and a reference light detector 90.

Here, the light having a continuous broadband spectrum from the bandwidth broadening part 30 may be separated by a beam splitter 45 or the like for also outputting to the reference light detector 90 to be described later apart from a light to be directed to the optical circulator 40.

The phase modulation signal generator 61 is configured to generate a phase modulation signal so as to reduce relative intensity noise. The phase modulation signal generator 61 outputs the phase modulation signal to the first phase modulator 52 and second phase modulator 54 of the multifunctional integrated optical circuit 50. The phase modulation signal generator 61 generates the phase modulation signal for the multifunctional integrated optical circuit 50 so as to perform phase modulation at odd multiples of the eigenfrequency of the fiber optic coil 2. Specifically, the phase modulation may be performed to be at odd multiples of one time, three times, five times, etc. of the eigenfrequency. This can reduce relative intensity noise. At this time, when phase modulation is performed at odd multiples and integral multiples of the eigenfrequency, it is possible to reduce thermal phase noise in addition to relative intensity noise as in the example illustrated in FIG. 10. That is, both the thermal phase noise and relative intensity noise can be reduced.

The reference light detector 90 detects a reference light intensity signal of the light having a continuous broadband spectrum from the bandwidth broadening part 30. That is, the reference light detector 90 uses the light having a continuous broadband spectrum from the bandwidth broadening part 30 as a reference light to detect the reference light intensity signal thereof.

The synchronous detector 81 uses the phase modulation signal from the phase modulation signal generator 61 as a reference signal to synchronously detect a sum signal of the light intensity signal detected by the optical detector 70 and the reference light intensity signal detected by the reference light detector 90 and outputs the detected sum signal as a detection signal of input angular velocity to the fiber optic coil 2.

The thus configured fiber optic gyroscope using the light source device for a fiber optic gyroscope according to the present invention performs phase modulation at odd multiples of the eigenfrequency of the fiber optic coil 2 to thereby make it possible to reduce relative intensity noise. Further, when phase modulation is performed at odd multiples and integral multiples of the eigenfrequency, it is possible to reduce thermal phase noise in addition to the relative intensity noise.

Incidentally, in this example, the phase modulation is performed at odd multiples, and the sum signal of the light intensity signal detected by the optical detector 70 and the reference light intensity signal detected by the reference light detector 90 is synchronously detected; alternatively, in place of this, a configuration may be possible, in which the phase modulation is performed at even multiples, and a difference signal between the light intensity signal detected by the optical detector 70 and the reference light intensity signal detected by the reference light detector 90 is synchronously detected. That is, the phase modulation signal generator 61 may generate the phase modulation signal for the multifunctional integrated optical circuit 50 so as to perform the phase modulation at even multiples of the eigenfrequency of the fiber optic coil 2. Accordingly, the synchronous detector 81 may synchronously detect the difference signal between the light intensity signal detected by the optical detector 70 and the reference light intensity signal detected by the reference light detector 90.

Here, the synchronous detector 80 illustrated in FIG. 10 or the synchronous detector 81 illustrated in FIG. 11 may use the phase modulation signal from the phase modulation signal generator 60 (61) as a reference signal to perform the synchronous detection. Further, a signal for canceling a phase difference between the counterclockwise light and the clockwise light generated by input angular velocity to the fiber optic coil 2 can be output to the phase modulation signal generator 60 (61) as a feedback control signal for feedback control of the phase modulation signal generator 60 (61). This can increase the dynamic range of the input angular velocity.

The light source device for a fiber optic gyroscope according to the present invention and the fiber optic gyroscope using the same are not limited to the illustrated examples but may be variously modified within the scope of the present invention.

EXPLANATION OF REFERENCE SYMBOLS

1: Fiber optic gyroscope
2: Fiber optic coil
10: Laser light source
20: Stabilizing part
21: SHG part
22: Atomic cell
30: Bandwidth broadening part
31: Optical comb generation part
32: White noise modulation part
33: Parametric down-conversion part
40: Optical circulator
50: Multifunctional integrated optical circuit
51: Polarizer
52: Branch/recombiner
53: First phase modulator
54: Second phase modulator
60, 61: Phase modulation signal generator
70: Optical detector
80, 81: Synchronous detector
90: Reference light detector

The invention claimed is:

1. A light source device for a fiber optic gyroscope configured to drive a fiber optic gyroscope having a fiber optic coil, the light source device comprising:
   a laser light source that emits a laser light of a predetermined frequency;
   a stabilizing part that stabilizes the predetermined frequency of the laser light emitted from the laser light source; and
   a bandwidth broadening part that includes an optical comb generation part and a white noise modulation part and that makes the laser light stabilized by the stabilizing part into a light having a continuous broadband spectrum, the optical comb generation part to which the laser light stabilized by the stabilizing part is inputted and which emits a light having a plurality of spectra equally spaced at predetermined intervals with a predetermined frequency as a center, and the white noise modulation part to which the light emitted from the optical comb generation part is inputted and which performs frequency modulation using white noise for making a continuous spectrum with a modulation width equal to or more than a predetermined interval of a plurality of spectra.

2. A light source device for a fiber optic gyroscope configured to drive a fiber optic gyroscope having a fiber optic coil, the light source device comprising:
   a laser light source that emits a laser light of a predetermined frequency;
   a stabilizing part that stabilizes the predetermined frequency of the laser light emitted from the laser light source; and
   a bandwidth broadening part that includes a white noise modulation part and an optical comb generation part and that makes the laser light stabilized by the stabilizing part into a light having a continuous broadband spectrum, the white noise modulation part to which the laser light stabilized by the stabilizing part is inputted and which performs frequency modulation using white noise for making a continuous spectrum with a predetermined modulation width, and the optical comb generation part to which the light emitted from the white noise modulation part is inputted and which emits a light having a plurality of spectra equally spaced at predetermined intervals that are equal to or less than a predetermined modulation width by using white noise, with a predetermined frequency as a center.

3. The light source device for a fiber optic gyroscope according to claim 1, in which
   the stabilizing part locks the laser light emitted from the laser light source to a reference frequency source for stabilization.

4. The light source device for a fiber optic gyroscope according to claim 2, in which
   the stabilizing part locks the laser light emitted from the laser light source to a reference frequency source for stabilization.

5. The light source device for a fiber optic gyroscope according to claim 1, in which the laser light source comprises a continuous laser light source that emits a continuous light.

6. The light source device for a fiber optic gyroscope according to claim 2, in which the laser light source comprises a continuous laser light source that emits a continuous light.

7. The light source device for a fiber optic gyroscope according to claim 3, in which the laser light source comprises a continuous laser light source that emits a continuous light.

8. A fiber optic gyroscope using the light source device for a fiber optic gyroscope as claimed in claim 1, further comprising:
- an optical circulator that separates between the light having a continuous broadband spectrum from the bandwidth broadening part and an interference light obtained by recombining a counterclockwise light and a clockwise light that have passed through a fiber optic coil;
- a multifunctional integrated optical circuit including a polarizer to which the light having a continuous broadband spectrum is inputted from the bandwidth broadening part through the optical circulator and which allows a single polarized light to pass therethrough, a Y-branch/recombiner that branches the light from the polarizer and makes the resultant lights enter both ends of the fiber optic coil and recombines counterclockwise light and clockwise light that have passed through the fiber optic coil as interference light, a first phase modulator that modulates a light to enter one end of the fiber optic coil, and a second phase modulator that modulates a light to enter an other end of the fiber optic coil;
- a phase modulation signal generator that generates, in order to reduce thermal phase noise, a phase modulation signal for performing phase modulation at integral multiples of an eigenfrequency of the fiber optic coil to the first and second phase modulators;
- an optical detector to which the interference light obtained by recombining the counterclockwise light and clockwise light that have passed through the fiber optic coil is inputted from the optical circulator and which detects a light intensity signal of the interference light; and
- a synchronous detector that uses the phase modulation signal from the phase modulation signal generator as a reference signal to synchronously detect the light intensity signal detected by the optical detector and outputs the detected light intensity signal as a detection signal of input angular velocity to the fiber optic coil.

9. A fiber optic gyroscope using the light source device for a fiber optic gyroscope as claimed in claim 2, further comprising:
- an optical circulator that separates between the light having a continuous broadband spectrum from the bandwidth broadening part and an interference light obtained by recombining a counterclockwise light and a clockwise light that have passed through a fiber optic coil;
- a multifunctional integrated optical circuit including a polarizer to which the light having a continuous broadband spectrum is inputted from the bandwidth broadening part through the optical circulator and which allows a single polarized light to pass therethrough, a Y-branch/recombiner that branches the light from the polarizer and makes the resultant lights enter both ends of the fiber optic coil and recombines counterclockwise light and clockwise light that have passed through the fiber optic coil as interference light, a first phase modulator that modulates a light to enter one end of the fiber optic coil, and a second phase modulator that modulates a light to enter an other end of the fiber optic coil;
- a phase modulation signal generator that generates, in order to reduce thermal phase noise, a phase modulation signal for performing phase modulation at integral multiples of an eigenfrequency of the fiber optic coil to the first and second phase modulators;
- an optical detector to which the interference light obtained by recombining the counterclockwise light and clockwise light that have passed through the fiber optic coil is inputted from the optical circulator and which detects a light intensity signal of the interference light; and
- a synchronous detector that uses the phase modulation signal from the phase modulation signal generator as a reference signal to synchronously detect the light intensity signal detected by the optical detector and outputs the detected light intensity signal as a detection signal of input angular velocity to the fiber optic coil.

10. A fiber optic gyroscope using the light source device for a fiber optic gyroscope as claimed in claim 1, further comprising:
- an optical circulator that separates between the light having a continuous broadband spectrum from the bandwidth broadening part and an interference light obtained by recombining a counterclockwise light and a clockwise light that have passed through a fiber optic coil;
- a multifunctional integrated optical circuit including a polarizer to which the light having a continuous broadband spectrum is inputted from the bandwidth broadening part through the optical circulator and which allows a single polarized light to pass therethrough, a Y-branch/recombiner that branches the light from the polarizer and makes the resultant lights enter both ends of the fiber optic coil and recombines counterclockwise light and clockwise light that have passed through the fiber optic coil as interference light, a first phase modulator that modulates a light to enter one end of the fiber optic coil, and a second phase modulator that modulates a light to enter an other end of the fiber optic coil;
- a phase modulation signal generator that generates, in order to reduce relative intensity noise, a phase modulation signal for performing phase modulation at odd multiples of an eigenfrequency of the fiber optic coil to the first and second phase modulators;
- an optical detector to which the interference light obtained by recombining the counterclockwise light and clockwise light that have passed through the fiber optic coil is inputted from the optical circulator and which detects a light intensity signal of the interference signal;
- a reference light detector that detects a reference light intensity signal of light having a continuous broadband spectrum from the bandwidth broadening part; and
- a synchronous detector that uses the phase modulation signal from the phase modulation signal generator as a reference signal to synchronously detect a sum signal of the light intensity signal detected by the optical detector and the reference light intensity signal output from the reference light detector and outputs the detected sum signal as a detection signal of input angular velocity to the fiber optic coil.

11. A fiber optic gyroscope using the light source device for a fiber optic gyroscope as claimed in claim 1, further comprising:
- an optical circulator that separates between the light having a continuous broadband spectrum from the bandwidth broadening part and an interference light obtained by recombining a counterclockwise light and a clockwise light that have passed through a fiber optic coil;

a multifunctional integrated optical circuit including a polarizer to which the light having a continuous broadband spectrum is inputted from the bandwidth broadening part through the optical circulator and which allows a single polarized light to pass therethrough, a Y-branch/recombiner that branches the light from the polarizer and makes the resultant lights enter both ends of the fiber optic coil and recombines counterclockwise light and clockwise light that have passed through the fiber optic coil as interference light, a first phase modulator that modulates a light to enter one end of the fiber optic coil, and a second phase modulator that modulates a light to enter an other end of the fiber optic coil;

a phase modulation signal generator that generates, in order to reduce relative intensity noise, a phase modulation signal for performing phase modulation at even multiples of an eigenfrequency of the fiber optic coil to the first and second phase modulators;

an optical detector to which the interference light obtained by recombining the counterclockwise light and clockwise light that have passed through the fiber optic coil is inputted from the optical circulator and which detects a light intensity signal of the interference light;

a reference light detector that detects a reference light intensity signal of light having a continuous broadband spectrum from the bandwidth broadening part; and a synchronous detector that uses the phase modulation signal from the phase modulation signal generator as a reference signal to synchronously detect a difference signal between the light intensity signal detected by the optical detector and the reference light intensity signal detected by the reference light detector and outputs the detected difference signal as a detection signal of input angular velocity to the fiber optic coil.

12. The fiber optic gyroscope according to claim 10, in which the phase modulation signal generator generates, in order to reduce thermal phase noise and relative phase noise, a phase modulation signal for performing phase modulation at integral multiples of the eigenfrequency of the fiber optic coil to the first and second phase modulators of the multifunctional integrated optical circuit.

* * * * *